United States Patent [19]

Hidaka et al.

[11] Patent Number: 4,760,559
[45] Date of Patent: Jul. 26, 1988

[54] SEMICONDUCTOR MEMORY DEVICE

[75] Inventors: Hideto Hidaka; Kazuyasu Fujishima; Masaki Kumanoya; Hideshi Miyatake; Katsumi Dosaka, all of Itami, Japan

[73] Assignee: Mitsubishi Denki Kabushiki Kaisha, Tokyo, Japan

[21] Appl. No.: 883,311

[22] Filed: Jul. 8, 1986

[30] Foreign Application Priority Data

Jul. 10, 1985 [JP] Japan .............................. 60-153453

[51] Int. Cl.$^4$ ............................................. G11C 7/00
[52] U.S. Cl. ..................................... 365/189; 365/230
[58] Field of Search ................ 365/189, 230, 233, 149

[56] References Cited

U.S. PATENT DOCUMENTS 4,476,548  10/1984  Matsumoto et al. ................ 365/233

Primary Examiner—Joseph A. Popek
Attorney, Agent, or Firm—Lowe, Price, Leblanc, Becker & Shur

[57] ABSTRACT

A dynamic type MOS-RAM constructed of folded type bit lines and having sense operation cycles for amplifying potential difference appearing on respective pairs of bit lines after selection of a word line and restore operation cycles for further amplifying the potential difference on the pairs of bit lines after the sense operation cycles, wherein non-selected word lines are completely brought into electrically floating states in intervals including the sense operation cycles and the restore operation cycles.

5 Claims, 4 Drawing Sheets

SEMICONDUCTOR MEMORY DEVICE

BACKGROUND OF THE INVENTION

1. Field of the Invention

The present invention relates to a semiconductor memory device, and more particularly, it relates to improvement in a method of driving word lines in a dynamic type MOS-RAM (Metal-Oxide Semiconductor Random Access Memory).

2. Description of the Prior Art

FIG. 1 partially illustrates an exemplary construction of a word line driving part of a conventional dynamic type semiconductor memory device.

Referring to FIG. 1, the word line driving part is formed by a plurality of memory cells 3 arranged in the form of a matrix for storing information, word lines $WL_0$, $WL_1$, ... connected with selection terminals (gate electrodes) of the memory cells 3 arranged in identical rows, bit lines BL and $\overline{BL}$ connected with data input-/output terminals of the memory cells 3 arranged in identical columns and intersecting over the word lines $WL_0$, $WL_1$, ..., a row address decoder 1 for decoding supplied row address signals, word line driving transistors $Q_{00}$, $Q_{10}$, ... provided for the respective ones of the word lines $WL_0$, $WL_1$, ... for receiving corresponding decoded address signals from the row address decoder 1 at the gates thereof to be turned on/off to transfer or not to transfer word line driving signals $\phi_R$ to the corresponding word lines $WL_0$, $WL_1$, ... thereby to select the same, transistors $Q_{01}$, $Q_{11}$, ... provided for the respective ones of the word lines $WL_0$, $WL_1$, ... to be turned on/off responsive to control signals from a control circuit 10a thereby to prevent erroneous selection of non-selected word lines, transistors $Q_{02}$, $Q_{12}$, ... provided for the respective ones of the word lines $WL_0$, $WL_1$, ... to be turned on/off in response to signals $\overline{RAS}$ for providing timings for introducing the row address signals thereby to hold the respective word lines at low levels in non-active cycles, the control circuit 10a for generating signals RQ for controlling operations of the transistors $Q_{01}$, $Q_{11}$, ..., sense amplifiers 2 for respectively sensing data appearing on the respective pair of bit lines BL and $\overline{BL}$ and restore circuits 4 for further amplifying potential difference appearing on the pairs of bit lines BL and $\overline{BL}$ after data sensing.

Each of the memory cells 3 is formed by a capacitor for storing information in the form of charges and a selection transistor for reading/writing the information from/in the capacitor. The selection transistor has a gate connected to one of the word lines $WL_0$, $WL_1$, ..., one conduction terminal connected to one of the bit lines BL and $\overline{BL}$ and another conduction terminal connected to one electrode of the storage capacitor.

Each of the transistors $Q_{00}$, $Q_{10}$, ... has a conduction terminal connected to the corresponding one of the word lines $WL_0$, $WL_1$, ..., another conduction terminal receiving the word line driving signal $\phi_R$ and a gate receiving the decoded address signal from the row address decoder 1.

Each of the transistors $Q_{01}$, $Q_{11}$, ... has a drain connected to the corresponding one of the word lines $WL_0$, $WL_1$, ..., a source connected with a ground potential and a gate receiving the control signals RQ.

Each of the transistors $Q_{02}$, $Q_{12}$, ... has a drain connected to the corresponding one of the word lines $WL_0$, $WL_1$, ..., a source connected with a ground potential and a gate receiving the signals $\overline{RAS}$.

The control circuit 10a is formed by n channel MOS transistors $Q_1$, $Q_2$ and $Q_3$. The transistor $Q_1$ has a source connected to a supply potential $V_{CC}$, a gate receiving the signal $\overline{RAS}$ and a drain connected to an output terminal. The transistor $Q_2$ has a source and a gate both connected to the supply potential $V_{CC}$ and a drain connected to the output terminal, to serve as a resistor. The transistor $Q_3$ has a drain and a gate both connected to the output terminal and a source receiving the signals $\overline{RAS}$, to serve as a resistor.

The control signals RQ from the control circuit 10a are delivered, responsive to the signals $\overline{RAS}$, to be supplied to the gates of the transistors $Q_{01}$, $Q_{11}$, .... Thus, the respective transistors $Q_{01}$, $Q_{11}$, ... are brought into ON states especially upon rise of potentials on the word lines $WL_0$, $WL_1$, ... and in restore operation of memory cell data, to bring the potentials on non-selected word lines into the ground potential level, thereby to prevent erroneous selection of the non-selected word lines.

The term "restore operation" indicates such operation as further amplifying the potential difference after the sense amplifier sensed to amplify a potential difference on a selected pair of bit lines.

FIG. 2 is a diagram showing operation waveforms of the circuit as shown in FIG. 1.

Referring to FIG. 2, the word lines are representatively shown by $WL_0$ and $WL_1$, and the bit lines are represented by a pair of bit lines BL and $\overline{BL}$.

A signal $\overline{RAS}$ is an active low row address strobe signal for supplying the timing for introducing a row address signal.

A signal RQ delivered from the control circuit 10a is a clock signal generated synchronously with fall of the signal $\overline{RAS}$, to slowly fall to a potential $V_T + \alpha$ at a time constant determined by the transistors $Q_2$ and $Q_3$ forming the control circuit 10a and serving as resistors. Symbol $V_T$ indicates the threshold voltage of the transistor $Q_3$ and the value $\alpha$, which is 0.1 to 0.2 V in general, depends on the driving ability of the transistors $Q_2$ and $Q_3$.

A signal $\phi_R$ rises in a delay by a predetermined delay time from the fall of the signal $\overline{RAS}$ to supply a predetermined potential to a selected word line, and the high level of $\phi_R$ is boosted to be higher than $V_{CC} + V_{TH}$ in order to completely read and write signal charges. Symbol $V_{CC}$ indicates the supply potential, and symbol $V_{TH}$ indicates the threshold voltage of the selection transistor of the memory cell 3 connected to the word line.

With reference to FIGS. 1 and 2, description is now made on data sensing operation in the conventional semiconductor memory device.

At a time $t_1$, the signal $\overline{RAS}$ starts falling thereby to start an active cycle for data sensing. Responsive to the fall of the signal $\overline{RAS}$, an external address signal is latched by a latch circuit (not shown) and the latched row address signal is supplied to the row address decoder 1. The row address decoder 1 decodes the supplied address signal, to supply a corresponding decoded address signal to the gates of the transistors $Q_{00}$, $Q_{10}$, .... In the control circuit 10a, the transistor $Q_1$ enters an OFF state responsive to the fall of the signal $\overline{RAS}$, and the control signal RQ is restricted by the resistance values of the transistors $Q_2$ and $Q_3$, to slowly fall.

At a time $t_2$, the output potential of the row address decoder 1 is stabilized so that only one decoder output becomes "1" and the other decoder outputs become "0", whereby the word line driving signal $\phi_R$ starts rising to be transferred to the word line $WL_0$ through the transistor $Q_{00}$ selected by the output of the row address decoder 1 to be conductive, and hence the signal level on the selected word line $WL_0$ starts rising. It is assumed here that the word line $WL_0$ is selected and the non-selected word line is represented by $WL_1$, for convenience of illustration.

The signal RQ is outputted from the MOS transistors $Q_2$ and $Q_3$ serving as resistors, and slowly falls responsive to rise of the signal $\overline{RAS}$ as shown in FIG. 2. The signal RQ is supplied to the gates of the transistors $Q_{01}$, $Q_{11}$, . . . for preventing erroneous selection. Thus, in the case where the word line driving signal $\phi_R$ rises before the non-selected decoder output is stabilized, i.e., before the same is sufficiently brought into a low level, the potential of the non-selected word line $WL_1$ is prevented from slightly floating up to be erroneously selected.

The word line driving signal $\phi_R$ is transferred onto the word line $WL_0$ through the transistor $Q_{00}$ in an ON state, whereby the potential on the word line $WL_0$ rises and the word line $WL_0$ is selected. As the result, the transistor of the memory cell 3 connected to the word line $WL_0$ enters an ON state, whereby information stored in the memory cell 3 is read out on the bit line BL, followed by potential difference between the bit lines BL and $\overline{BL}$.

At a time $t_3$, the sense amplifier 2 connected with the pair of bit lines BL and $\overline{BL}$ is activated by an activating means (not shown), whereby the lower-potential one of the pair of bit lines BL and $\overline{BL}$ is brought into the ground potential level.

At a time $t_4$, the restore circuit 4 is activated by an activating means (not shown) to perform restore operation, whereby the higher-potential one of the pair of bit lines BL and $\overline{BL}$ is boosted to the level of the supply potential $V_{CC}$. The potential of the signal RQ is ($V_T+\alpha$) at this time. Thus, the respective word lines $WL_0$ and $WL_1$ are connected to the ground potential through the high-resistance transistors $Q_{01}$ and $Q_{11}$, whereby the potential of the non-selected word line is prevented from floating up through stray coupling capacitance of the bit lines and the word lines, and hence erroneous selection is prevented.

At a time $t_5$, the signal $\overline{RAS}$ rises to complete the active cycle.

In order to completely read and write the signal charges, the word line driving signal $\phi_R$ is boosted to be higher than $V_{CC}+V_{TH}$, as described hereinbefore. Such boosting is generally achieved by supplying the word line with charges precharged at capacitance (such step is not shown). In this case, however, the transistors $Q_{01}$, $Q_{11}$, . . . are in high-resistance states through the signal RQ, and the word line potentials are lowered by currents weakly flowing from the word lines to the ground potential level through the high-resistance transistors $Q_{01}$, $Q_{11}$, . . . , and hence the word line potentials cannot be held at sufficiently high levels.

In the aforementioned word line driving circuit of the conventional dynamic type MOS-RAM, currents flow through the erroneous-selection-preventing transistors $Q_{01}$, $Q_{11}$, . . . to reduce the word line potentials, and hence the selected word lines cannot be held at sufficiently high levels.

U.S. Pat. No. 4,476,548 to T. Matsumoto et al. entitled "Dynamic Type MOS Memory Device" discloses a memory device in which word line pull-down transistors for connecting word line potentials to the ground potential are turned on for a short period of time upon rise of the word line potentials.

SUMMARY OF THE INVENTION

It is an object of the present invention to overcome the aforementioned disadvantages and provide a semiconductor memory device which can sufficiently increase word line potentials, while preventing non-selected word line potentials from floating up to be erroneously selected, employing simple means.

In a word line driving circuit in a semiconductor memory device according to the present invention, non-selected word lines are completely brought into electrically floating states before sensing of bit line data.

In more concrete terms, erroneous-selection preventing-transistors $Q_{01}$, $Q_{11}$, . . . connected to word lines are completely brought into OFF states during intervals including sense cycle and restore cycle for bit line data.

In the word line driving circuit according to the present invention, word lines are completely brought into electrically floating states during intervals from before sense operation to after restore operation of bit line data, whereby potential on a selected word line is held at high level. Non-selected word lines are held at negative levels through stray coupling capacitance between word lines and bit lines in sensing of the bit line data, thereby to prevent the non-selected word lines from floating up to be erroneously selected through coupling capacitance between the bit lines and the word lines in the restore operation cycle.

These and other objects, features, aspects and advantages of the present invention will become more apparent from the following detailed description of the present invention when taken in conjunction with the accompanying drawings.

DESCRIPTION OF THE PREFERRED EMBODIMENT

Description is now made on an embodiment of the present invention with reference to the accompanying drawings.

Figure 3:
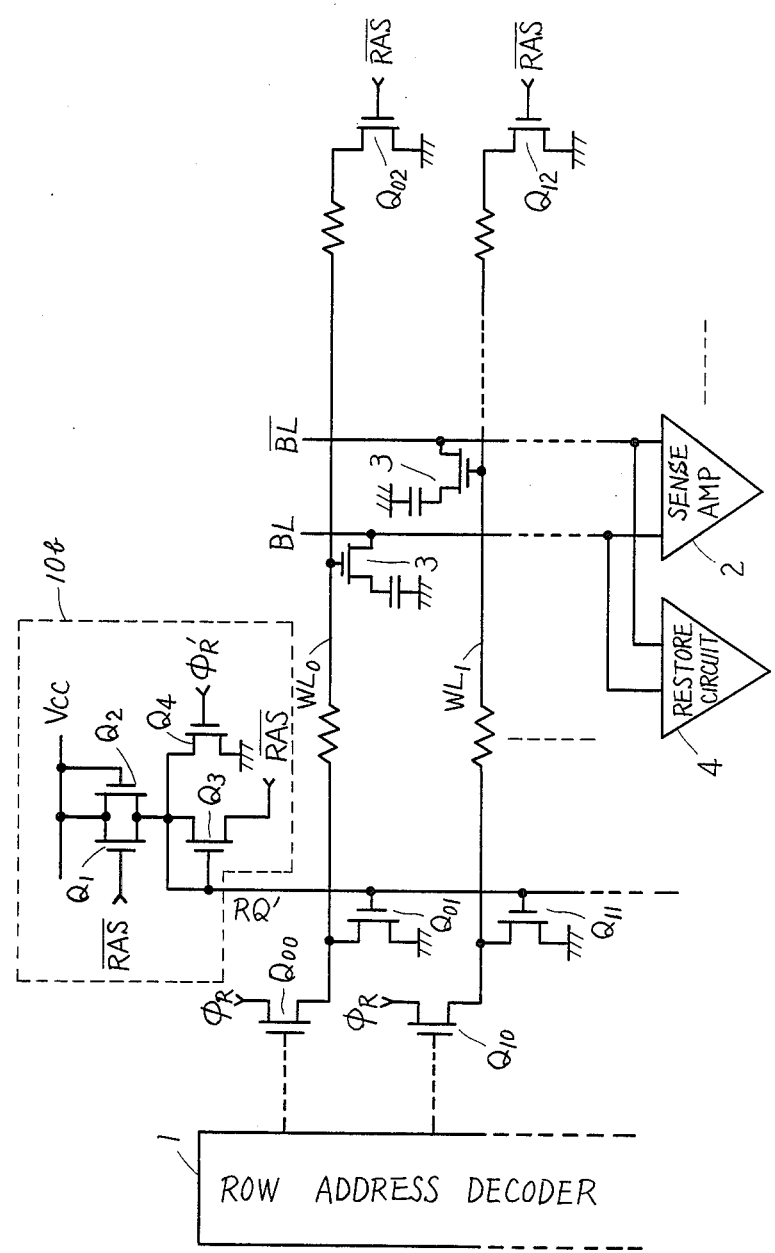
FIG. 3 is a diagram showing the construction of a word line driving part of a dynamic type MOS-RAM according to an embodiment of the present invention.

FIG. 3 is a diagram showing the construction of a word line driving part of a semiconductor memory device, which is provided with a word line driving circuit according to an embodiment of the present invention. The semiconductor memory device as shown in FIG. 3 is different from that of FIG. 1 in that a transistor $Q_4$ is newly provided in a circuit 10b for delivering control signals to transistors $Q_{01}$, $Q_{11}$, . . . for preventing erroneous selection of word lines. The transistor $Q_4$ has a drain connected to the output terminal of the circuit 10b for generating control signals RQ', a source grounded and a gate receiving new second control signals $\phi_R'$. The second control signals $\phi_R'$ are brought into high levels in data sensing of bit lines, and fall upon completion of restore operation for the bit lines.

Figure 4:
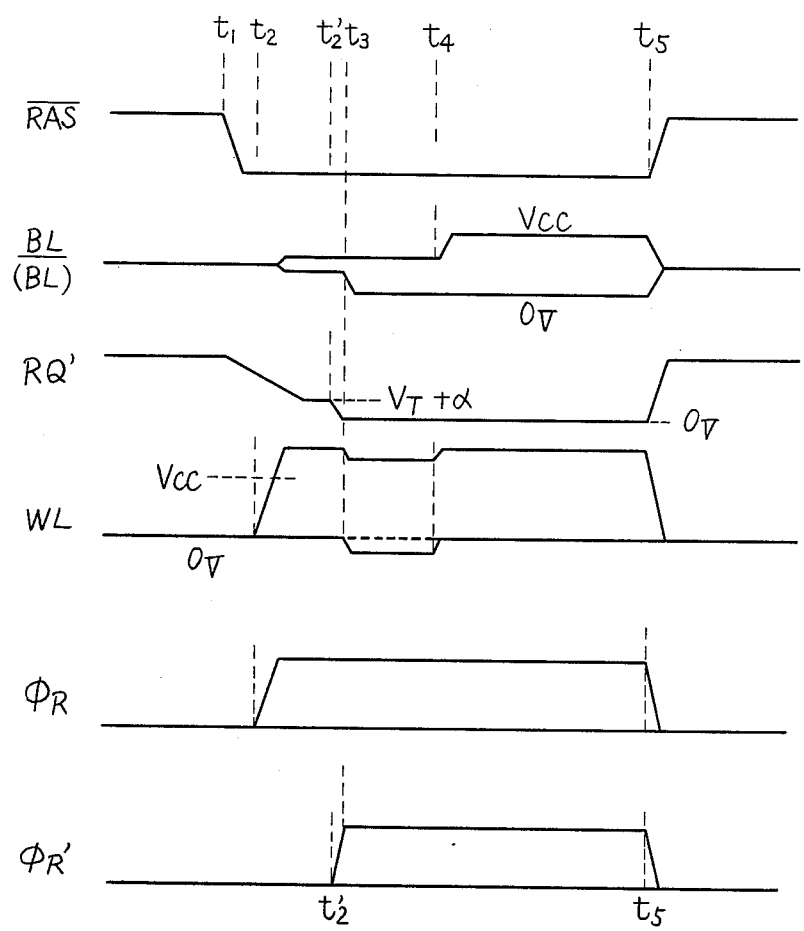
FIG. 4 is a diagram showing operation waveforms of the circuit as shown in FIG. 3.

FIG. 4 is an operation waveform diagram showing operation timings of the circuit as shown in FIG. 3, and respective signals correspond to those in FIG. 3. With reference to FIGS. 3 and 4, description is now made on the operation of the semiconductor memory device according to the present invention.

Figure 1:
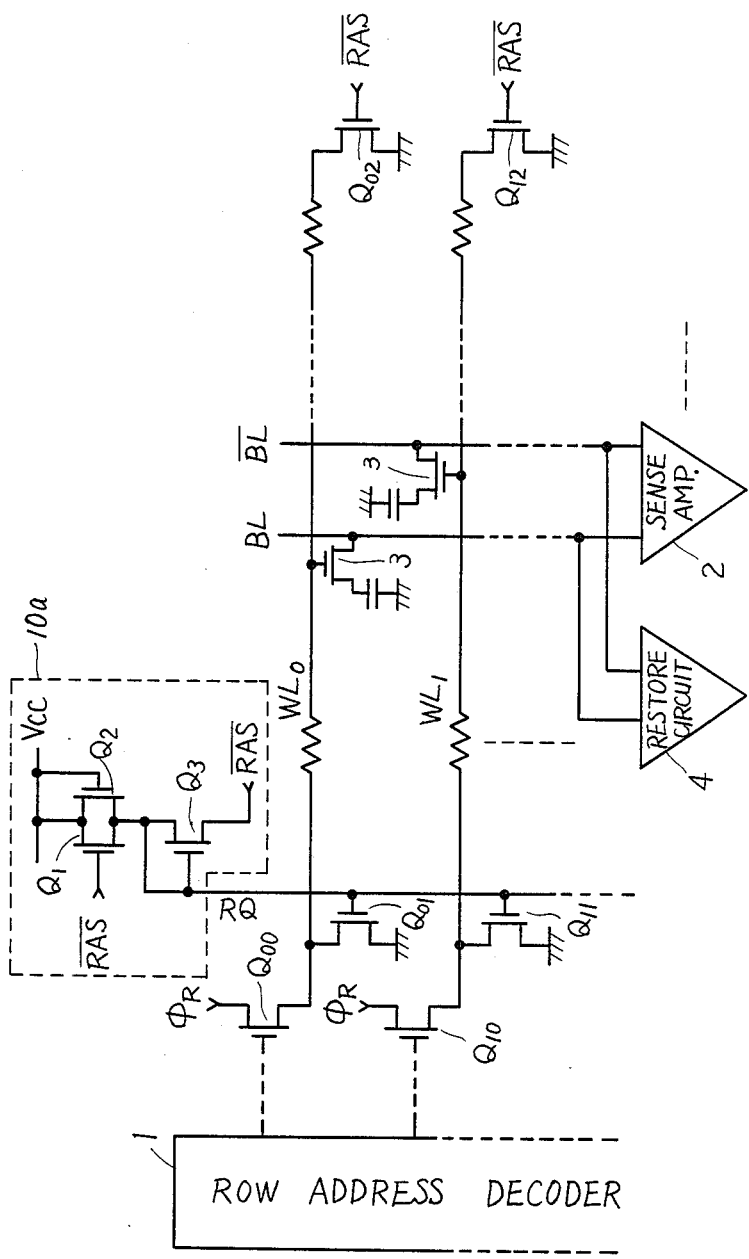
FIG. 1 is a diagram schematically showing the construction of a word line driving part of a conventional dynamic type MOS-RAM.
Figure 2:
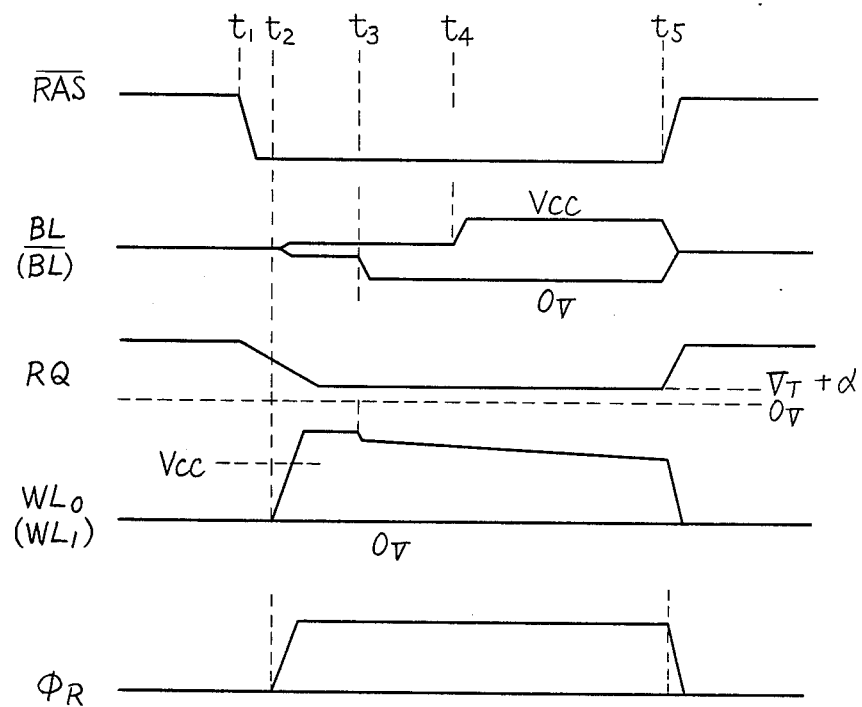
FIG. 2 is a diagram showing operation waveforms of the circuit as shown in FIG. 1.

One word line is selected by the output from a row address decoder 1. The potential of the selected word line rises by receiving word line driving signals $\phi_R$ through memory selection transistor gate in ON state. Then the second control signal $\phi_R'$ rises at a time $t_2'$ before a time $t_3$ of data sensing on pairs of bit lines BL and $\overline{BL}$. Operation till the time $t_2'$ is identical to that in the conventional semiconductor memory device as shown in FIG. 1.

At the time $t_2'$, the second control signals $\phi_R'$ rise and the transistor $Q_4$ responsively enters an ON state, whereby the output terminal of the control circuit 10b is connected with the ground potential. Thus, the signal RQ' is brought into the ground potential level.

The erroneous selection preventing transistors $Q_{01}$, $Q_{11}$, . . . receiving the signals RQ' at the gates thereof completely enter OFF states, whereby the non-selected word lines enter electrically floating states, because the transistors $Q_{02}$, $Q_{12}$, . . . are already in OFF states through fall of signals $\overline{RAS}$ at this time.

At the time $t_3$, sense amplifiers 2 are activated to sense data stored in memory cells 3 connected to the selected word line, and potentials of half of the bit lines are lowered from a precharge level $V_{CC}/2$ (or $V_{CC}$ etc.) to the ground potential level. Such lowering of the potentials serves to reduce word line potentials through stray coupling capacitance between the word lines and the bit lines associated with intersection thereof. The potentials of the non-selected word lines reach $-V_T$ to be clamped at the same through the transistors $Q_{01}$, $Q_{11}$, . . . and $Q_{02}$, $Q_{12}$, . . . . Symbol $V_T$ indicates the threshold voltage of the transistors $Q_{01}$, $Q_{11}$, . . . and $Q_{02}$, $Q_{12}$, . . .

At the time $t_4$, restore circuits 4 are activated by activating means (not shown) to perform restore operation, whereby the potentials of the remaining half of the bit lines, i.e., the potentials not being lowered to the ground potential level in sensing, are raised from the precharge level ($\frac{1}{2}$). $V_{CC}$ to the level of the supply potential $V_{CC}$. Such raising of the potentials serves to increase the word line potentials through the stray coupling capacitance between the word lines and the bit lines. At this time, the potentials of the non-selected word lines are shifted in the negative direction by $V_T$ at the maximum in sensing, and increase in the word line potentials is reducable by the shift amount. In general, no coupling noise is generated to reach $-V_T$ in sensing operation, and hence the potentials of the non-selected word lines return to the ground potential level in restore operation. Thus, the non-selected word lines are held at the negative or ground potential level during the interval from $t_3$ to $t_5$, whereby no erroneous selection of the non-selected memory cells is caused by floating-up of the non-selected word lines.

Similarly, the selected word line (represented by $WL_0$) receives coupling noise in the negative direction in sensing and in the positive direction in restore operation so that the potential of the word line returns to the original level while the signal RQ' is at the ground potential level, whereby substantially no current flows through the transistor $Q_{01}$ and the selected word line level is not reduced, unlike the case in the conventional semiconductor memory device.

According to the present invention as hereinabove described, no current flows between the word lines and the ground point after rise of the selected word line level while the non-selected word line levels do not float up in the positive direction, and hence the boosted level of the word line is not decreased while no erroneous selection of the non-selected word lines is caused in the word line driving circuit, whereby a stable semiconductor memory device can be obtained without erroneous operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a row address decoder for decoding row address signals and outputting the same;
a plurality of memory selection gates respectively being turned on/off in response to signals from said row address decoder;
a plurality of word lines connected with respective ones of said plurality of memory selection gates;
a plurality of pairs of bit lines provided to intersect over said word lines;
a plurality of memory cells each connected with one of said word lines and one of said bit lines;
a plurality of sense amplifiers each provided for respective one of said plurality of pairs of bit lines to detect potential difference on said respective pair of bit lines and amplify the same;
a plurality of restore circuits each provided for respective one of said plurality of pairs of bit lines to further amplify said potential difference on said respective pair of bit lines amplified by said sense amplifier; and
means operatively coupled to said plurality of word lines for holding non-selected word lines in electrically floating states only throughout intervals in which said sense amplifiers and said restore circuits are activated.

2. A semiconductor memory device in accordance with claim 1, wherein said holding means comprises a plurality of switching transistors for preventing non-selected word lines from being erroneously selected, each of said switching transistors coupled to respective ones of said plurality of word lines, and a control circuit coupled to said plurality of switching transistors for controlling the turn on and off of said switching transistors.

3. A semiconductor memory device in accordance with claim 2, wherein said control circuit causes said plurality of switching transistors to be turned off in intervals including both an interval in which said sense amplifiers are in activated states and an interval in which said restore circuits are in activated states.

4. A semiconductor memory device in accordance with claim 2, wherein said switching transistors are MOS transistors.

5. A semiconductor memory device in accordance with claim 2, wherein said control circuit includes:

a first MOS transistor having a source and a gate both connected with a supply potential and a drain connected to an output terminal, a second MOS transistor having a source connected to said supply potential, a gate receiving inverted row address strobe signals and a drain connected to said output terminal, a third MOS transistor having a drain and a gate both connected to said output terminal and a source receiving said inverted row address strobe signals, and a fourth MOS transistor having a source grounded, a drain connected with said output terminal and a gate receiving second control signals becoming active levels in intervals in which said sense amplifiers are in activated states and intervals in which said restore circuits are in activated states.

* * * * *